United States Patent [19]
Kaihotsu et al.

[11] Patent Number: 5,796,847
[45] Date of Patent: Aug. 18, 1998

[54] SOUND REPRODUCTION APPARATUS

[75] Inventors: Yuji Kaihotsu, Yokohama; Toshikazu Chiba, Zushi; Katsushi Yamada, Yokohama, all of Japan

[73] Assignee: Matsushita Electric Industrial Co. Ltd.

[21] Appl. No.: 522,925

[22] Filed: Sep. 1, 1995

[30] Foreign Application Priority Data

Sep. 6, 1994 [JP] Japan .................. 6-212417
Oct. 18, 1994 [JP] Japan .................. 6-251891

[51] Int. Cl.$^6$ .................................................. H03G 3/20
[52] U.S. Cl. ........................ 381/57; 381/108; 345/222
[58] Field of Search ........................ 381/57, 107, 108, 381/109, 104; 455/217, 219, 222, 232.1, 234.1

[56] References Cited

U.S. PATENT DOCUMENTS

| | | | |
|---|---|---|---|
| 3,497,622 | 2/1970 | Markin et al. | 381/57 |
| 4,357,492 | 11/1982 | Campbell et al. | 381/107 |
| 4,628,526 | 12/1986 | Germer | 381/57 |
| 4,864,246 | 9/1989 | Kato et al. | 381/57 |
| 5,034,984 | 7/1991 | Bose | 381/107 |
| 5,081,682 | 1/1992 | Kato et al. | 381/57 |
| 5,107,539 | 4/1992 | Kato et al. | 381/57 |
| 5,530,761 | 6/1996 | D'Alayer De Costemore D'Arc | 381/57 |

*Primary Examiner*—Curtis Kuntz
*Assistant Examiner*—Vivian Chang
*Attorney, Agent, or Firm*—Rossi & Associates

[57] ABSTRACT

A sound reproduction apparatus for a vehicle comprises: a sound source for generating a sound signal; a sound reproduction portion for reproducing a sound from the sound signal into a compartment of the vehicle; a microphone, provided in the compartment, for detecting the sound transmitted in the compartment and environmental sound noise and for generating a sound detection signal; a detection portion for detecting a magnitude of the environmental sound noise by detecting a difference between magnitudes of the sound signal and the sound detection signal; and a volume control portion for effecting volume controlling of the sound signal according to the magnitude of the environmental sound noise from the detection portion. An equalizing portion substantially equalizing gains of signal paths of the sound signal and sound detection signal supplied to the detection portion in a substantially silent condition of the compartment is provided. For accurate equalizing of gains, a reference sound signal source is provided. A part of frequency range of the sound signal is enhanced according to the sound noise. The volume controlling with the environmental sound noise is modified according to a peak level, an external volume control signal. The noise level may be classified. A large change in the volume within a short interval is avoided.

15 Claims, 7 Drawing Sheets

5,796,847

1

SOUND REPRODUCTION APPARATUS

BACKGROUND OF THE INVENTION

1. Field of the Invention

This invention relates to a sound reproduction apparatus and particularly to a sound reproduction apparatus used in a vehicle.

2. Description of the Prior Art

A sound reproduction apparatus used in a vehicle comprising a sound source, a volume adjusting circuit, a speaker unit having a power amplifier, and a volume control unit having a microphone for receiving a sound from the speaker for controlling the volume adjusting circuit in accordance with the received sound, a speed signal, and an engine rotation speed signal is known.

FIG. 8 is a block diagram of such a prior art sound reproduction apparatus. A microprocessor 210 predicts a sound noise level in a compartment of a vehicle in which the sound reproduction apparatus is provided in accordance with the received sound from the speaker 204, the speed signal 208, and the engine rotation speed signal 209 and controls the volume control unit 202 in accordance with the predicted sound noise level. Therefore, a sound intensity level of the sound from the speaker 204 driven by a power amplifier 203 amplifying an output of the volume adjusting circuit 202 receiving a sound signal from a sound source 201 is adjusted in accordance with the sound noise condition detected by the sound noise detection portion in the microprocessor 210.

SUMMARY OF THE INVENTION

The present invention has been developed in order to provide an improved sound reproducing apparatus.

According to the present invention there is provided a sound reproduction apparatus for a vehicle comprising: a sound source for generating a sound signal; a sound reproduction portion for generating and emitting a sound from the sound signal into a compartment of the vehicle; a microphone, provided in the compartment, for detecting the sound transmitted in the compartment and an environmental sound noise and for generating a sound detection signal; a detection portion for detecting a magnitude of the environmental sound noise by detecting a difference between magnitudes of the sound signal and the sound detection signal; and a volume control portion for effecting volume controlling of the sound signal in accordance with the magnitude of the environmental sound noise from the detection portion.

The sound reproduction apparatus may further comprise an equalizing portion for substantially equalizing a first gain of a first signal path of the sound signal supplied to the detection portion and a second gain of a second signal path of the sound detection signals supplied to the detection portion. In this case, the equalizing portion determines the first and second gains when a conditional signal indicates a substantially silent condition of the compartment. Moreover, in this case, the sound reproduction apparatus may further comprise a reference sound signal generation portion for generating a reference sound signal having a predetermined intensity as the sound signal when the equalizing portion determines the first and second gains. Further, in this case, the sound source may comprise a radio receiver, having a tuner, for generating the sound signal having a substantially predetermined intensity as a reference sound signal by tuning the tuner in a non-tuned condition when the equalizing portion determines the first and second gains.

In the sound reproduction apparatus, the volume control portion may effect the volume controlling of the sound

2 signal such that the sound signal is enhanced at a part of audio frequency range of the sound signal, for example, a low frequency.

The sound reproduction apparatus, may further comprise a lowpass filter for lowpass-filtering the sound signal supplied to the detection portion or a lowpass filter for lowpass-filtering the sound detection signal supplied to the detection portion.

In the sound reproduction apparatus, the volume control portion may further effect second volume controlling of the sound signal in accordance with an external volume control signal and the volume control portion effects the volume controlling of the sound signal in accordance with the magnitude of the environmental sound noise from the detection portion such that a change in a volume of the sound signal is changed in accordance with a value of the external volume control signal.

In the sound reproduction apparatus, the detection portion may further comprise an averaging portion for obtaining an average of the difference for a predetermined averaging period and the volume control portion effects the volume controlling of the sound signal in accordance with the average of the difference. In this case, the detection portion may further comprise a classifying portion for classifying the average of the difference into predetermined volume classes and the volume control portion effects the volume controlling of the sound signal in accordance with one of the predetermined volume class determined. In this case, the detection portion may further comprise an operation portion for obtaining a change between one of the predetermined volume classes determined from the average currently obtained and another of the predetermined volume classes determined from the average previously obtained, a comparing portion for comparing the change with a reference value, and a limiting portion for changing one of the predetermined volume classes determined from the average currently obtained to another class such that the change is limited when the change is larger than the reference value.

In the sound reproduction apparatus, the volume control portion may comprise a signal processing circuit for enhancing the sound signal at a low-frequency range in accordance with the magnitude of the environmental sound noise from the detection portion.

The sound reproduction apparatus may further comprise a peak detection portion for detecting a peak level for a predetermined interval and a comparing portion for comparing the detected peak level with a reference value, the volume control portion effecting the volume controlling of the sound signal when the detected peak level is smaller than the reference value.

In the sound reproduction apparatus, the volume control portion may further effect second volume controlling of the sound signal in accordance with an external volume control signal, further comprise a comparing portion for comparing a value of the external volume control signal with a reference value, and effect the volume controlling of the sound signal when the value of the external volume control signal is smaller than the reference value.

In the sound reproduction apparatus, the volume control portion increases a volume of the sound signal in accordance with the magnitude of the environmental sound noise from the detection portion.

BRIEF DESCRIPTION OF THE DRAWINGS

The objects and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described a first embodiment of this invention.

Figure 1:
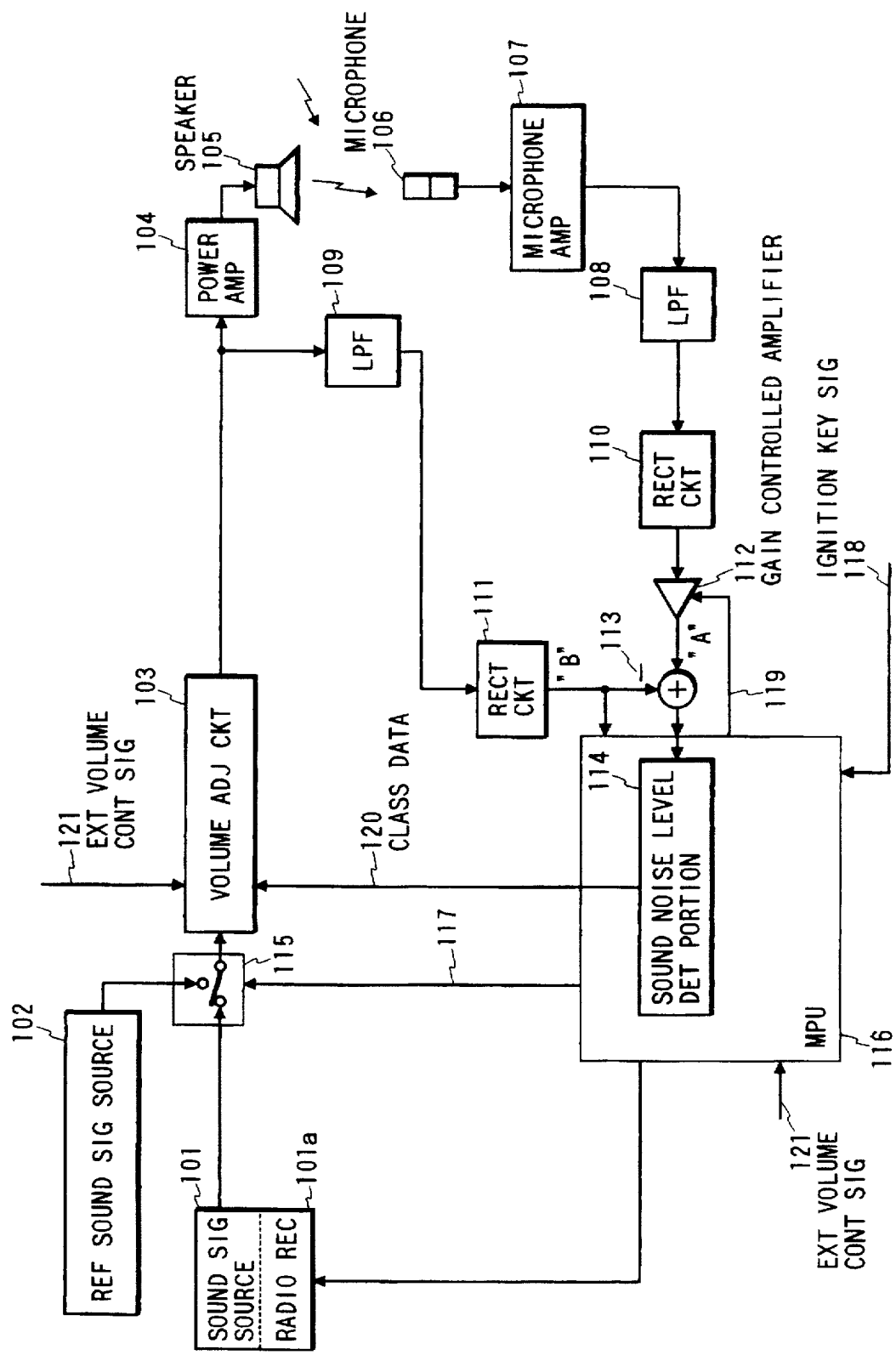
FIG. 1 is a block diagram of a sound reproduction apparatus of a first embodiment.

FIG. 1 is a block diagram of a sound reproduction apparatus of the first embodiment. The sound reproduction apparatus of the first embodiment comprises a sound source 101 for generating a sound signal, a reference sound signal source 102 for generating a reference sound signal having a predetermined intensity, a switch 115 for outputting either of an output of the sound signal source 101 or an output of the reference sound signal source 102, a volume adjusting circuit 103 for adjusting a volume of an output of the switch 115, i.e., adjusting a gain of an output thereof, a power amplifier 104 for amplifying an output of the volume adjusting circuit 103, a lowpass filter 109 for lowpass-filtering an output of the volume adjusting circuit 103, a rectifying circuit 111 for detecting a magnitude of an output of the lowpass filter 109, namely, an absolute value of the magnitude of the output of the lowpass filter 109, through rectifying, a speaker 105 for generating a sound from an output of the power amplifier 104, a microphone 106 for receiving the sound from the speaker 105 and receiving environmental noise sounds, such as an engine running sound, in a compartment of a vehicle in which this sound reproduction apparatus is provided, a microphone amplifier 107 for amplifying the output of the microphone 106, a lowpass filter 108 for lowpass-filtering an output of the microphone amplifier 107, a rectifying circuit 110 for detecting a sound intensity of the sound from the speaker 105 by rectifying an output of the lowpass filter 108 to obtain an absolute magnitude value of the output of the lowpass filter 108, a gain controlled amplifier 112 for amplifying the output of the rectifying circuit 110 with a gain thereof controlled, a subtractor 113 for subtracting an output of the rectifying circuit 111 from an output of the gain controlled amplifier 110, a sound level detection portion 114, included in a microprocessor 116, for detecting a magnitude of the sound noise in the compartment of the vehicle through averaging the output of the subtractor 113 and classifying the averaged output of the subtractor 113, wherein the volume control circuit 103 is controlled in accordance with the classified averaged output of the subtractor 113 and the microprocessor 116 controls the switch 115 and detects the output of the subtractor 113 and generates a gain control signal 119 supplied to the gain controlled amplifier 112 to control of a gain of the gain-controlled amplifier 112 such that an output of the subtractor 113 is substantially zero when there is no sound noise in the compartment. The sound noise level detection portion 114 has a memory originally provided to the microprocessor 116 which stores the output of the subtractor 113 every a predetermined interval a predetermined times for an averaging period and stores the current average value as a previous averaged value till the end of the next averaging operation (period), i.e., till the current averaged value is obtained. The gain controlled amplifier and the microprocessor 116 controlling the gain-controlled amplifier 110 act as an equalizing portion for equalizing gains of signal paths from the volume adjusting circuit 103 to the subtractor 113 via the rectifying circuit 111 and from the microphone 106 to the subtractor 113.

An operation of the first embodiment will be described.

The sound source 101 such as a magnetic tape player, a radio, or the like generates a sound signal. The reference sound source 102 generates the reference sound signal having a predetermined intensity. The switch 115 outputs either of the sound signal or the reference sound signal in accordance with a switch control signal 117. The volume adjusting circuit 103 supplies a volume adjusted sound signal from the output of the switch 115 to the power amplifier 104 and to the lowpass filter 109. The power amplifier 104 amplifies the output of the volume adjusting circuit 103. The lowpass filter 109 lowpass-filters the output of the volume adjusting circuit 103 to limit a detection frequency range. The rectifying circuit 111 detects the magnitude of the output of the lowpass filter 109, namely, an absolute value of the magnitude of the output of the lowpass filter 109, through rectifying. The speaker 105 generates a sound from an output of the power amplifier 104. The microphone 106 receives the sound from the speaker 105 transmitted through the air in a compartment of a vehicle and receives environmental sound noises in the compartment of the vehicle in which this sound reproduction apparatus is provided to produce a sound detection signal. The microphone amplifier 107 amplifies the sound detection signal. The lowpass filter 108 lowpass-filters the output of the microphone amplifier 107 to limit a detection frequency range. The rectifying circuit 110 detects the sound intensity of the sound from the speaker 105 and the environment sounds by rectifying the output of the lowpass filter 108, i.e., by producing an absolute value of the output of the amplifier 107. The gain controlled amplifier 112 amplifies the output of the rectifying circuit 110 with the gain controlled such that the output of the subtractor 113 is substantially zero when there is substantially no sound noise. This means that the gain controlled amplifier 112 and the microprocessor 116 equalizes the gains of the signal paths from the volume adjusting circuit 103 and the microphone 106 to the subtractor 113. The subtractor 113 subtracts the output of the rectifying circuit 111 from the output of the gain controlled amplifier 110. The sound level detection portion 114 (microprocessor 116) averages the output of the subtractor 113 and classifies the averaged output of the subtractor 113. The volume control circuit 103 is controlled in accordance with the classified averaged output of the subtractor 113. The microprocessor 116 controls the switch 115 and detects the output of the subtractor 113 and generates the gain control signal 119 supplied to the gain controlled amplifier 112 as the sound noise level detection portion 114. Therefore, the microprocessor 116 has at least an analog input and a/d-converting portion and has a memory for storing values of the output of subtractor 113 every predetermined interval a predetermined times for obtaining an average for an averaging period. The memory stores previous average value obtained for the previous averaging period and current average value obtained for the current averaging period. The microprocessor receives the output of the rectifying circuit 111 for obtaining a peak level of the sound signal for a predetermined peak level detection interval.

Figure 2:
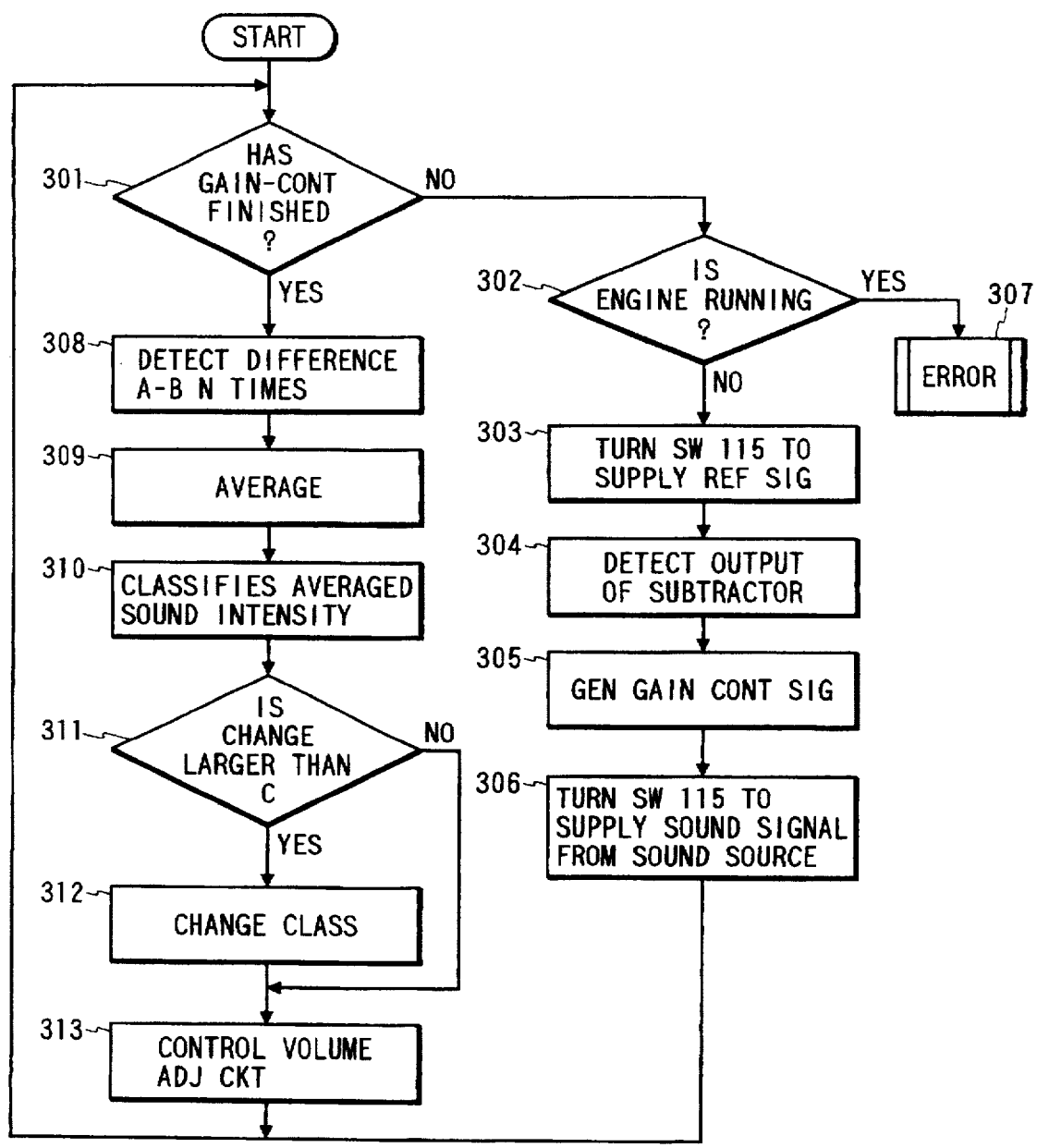
FIG. 2 is a diagram of a flow chart of the first embodiment.

FIG. 2 is a diagram of a flow chart of the first embodiment. The microprocessor 116 executes a program stored therein as shown in the flow chart in FIG. 2. At first, the gain controlling of the gain controlled amplifier 112 is executed. The microprocessor 116 makes a decision as to whether or not the gain controlling has finished in step 301. If the gain controlling has finished, processing proceeds to step 308. If the gain controlling has not finished, the microprocessor 116 makes a decision as to whether or not the engine (not shown) is running by checking an ignition key signal or the like in step 302. If the engine is running, processing proceeds to an error processing where an error processing is executed in step 307. If the engine is not running in step 302, that is, there is substantially no environmental sound noise in the compartment of the vehicle, the microprocessor 116 controls the switch 115 to supply the output of the reference signal generator 102 to the volume adjusting circuit 103 and operates the reference signal generation circuit 102 in step 303. In the following step 304, the microprocessor 116 detects the output of the subtractor 113 which is obtained by subtracting the absolute value B of the output of the rectifier 111 from the absolute value A of the output of the gain controlled amplifier 112 in step 304 or obtaining a difference between the absolute value B of the output of the rectifier 111 and the absolute value A of the output of the gain controlled amplifier 112 in step 304. Then, the microprocessor 116 determines the gain making the absolute value B of the output of the rectifier 111 substantially equal to the absolute value A of the gain controlled amplifier 112 and the controls the gain of the gain controlled amplifier 112 in step 305 by generating the gain control signal 119. The gain control signal 119 may be generated through an d/a converter originally provided to the microprocessor 116. Then, the microprocessor 116 controls the reference signal generator 102 to stop the generation of the reference signal and controls the switch 115 to supply the output of the sound source 101 to the volume adjusting circuit 103 in step 306. Then, processing returns to step 301.

In this condition, the difference between the absolute values of the rectifier 111 and the gain controlled amplifier 112 corresponds to an environmental sound noise detected by the microphone 106, that is, a sound noise from the engine, a sound noise from other vehicles or the like.

In step 301, if the gain controlling has finished, the microprocessor 116 detects the difference between the absolute value A of the output of the rectifier 111 and the output B of the gain controlled amplifier 112, that is, the output of the subtractor 113 subtracting the output of the rectifier 111 from the output of the gain controlled amplifier 112 and repeats this operation every a predetermined interval N times in step 308 to a predetermined number N of difference values (N is a natural number). In the following step 309, the microprocessor 116 averages the predetermined number N of difference values to obtain an average value for an averaging period. Then, the microprocessor 116 classifies the average value into a predetermined number of classes with predetermined threshold levels in step 310. In step 311, the microprocessor 116 makes a decision as to whether or not a change between the currently classified average value and average value at the last time is larger than a predetermined value C. If the change is larger than the predetermined value C, the microprocessor 116 changes the class with the change limited in step 312. If the change is not larger than the predetermined value, the microprocessor 116 does not change the class and processing proceeds to step 313 directly. In step 312, the microprocessor 116 outputs a class data indicative of the determined class to control the volume adjusting circuit 103 as a volume control signal.

The volume adjusting circuit 103 effects volume controlling in accordance with an external volume control signal 121 and the microprocessor 116 effects the volume controlling in accordance with the detected environmental sound noise when a value of the external volume control signal 121 is smaller than a reference value. The microprocessor 116 detects a peak level for a peak level detection period and the microprocessor 116 effects the volume controlling in accordance with the detected environmental sound noise when a value of the peak level is smaller than a reference peak value.

Figure 3:
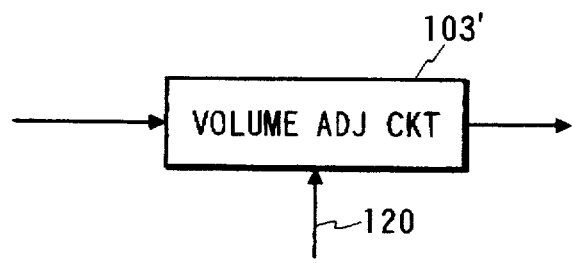
FIG. 3 is a partial block diagram of a modification of the first embodiment.

FIG. 3 is a partial block diagram of a modification of the first embodiment. The volume adjusting circuit 103 is replaced by a volume adjusting circuit 103' for adjusting a volume within a predetermined frequency range, that is, a low frequency. In other words, the volume of the low frequency range is adjusted in accordance with the class data 120 from the sound level detection portion 114, i.e., the volume of the low frequency range is increased in accordance with the detected environmental sound noise and the volume of the middle and high frequency ranges are fixed. Moreover, a volume adjusting circuit for controlling the volume of the low frequency and the high frequency ranges without the middle frequency range may be provided.

As mentioned, the actual sound noise in the compartment of the vehicle can be detected by obtaining the difference between the sound intensity of the sound signal from the reference signal generator 102 or the sound source 101 and the sound detection signal generated by the microphone 106 by detecting the sound from the speaker 105 transmitted through the air in the compartment of the vehicle and the environmental noise wherein the gain of the sound signal and the gain of the sound detection signal from the microphone 106 are equalized each other when there is substantially no environmental sound noise. This equalization is made using the reference signal generator 102 to obtain an accurate equalization. However, it is also possible to use the sound signal from the sound source 101, particularly, the noise generated by the radio circuit when the radio circuit is not tuned as a quasi-white noise. Further, the difference values are averaged to obtain an accurate difference value. That is, the microprocessor 116 controls a radio receiver 101a included in the sound signal source 101 to supply a white noise in the non-tuned condition. Moreover, the change between the currently classified averaged difference value (class) and the classified averaged difference value (class) at the last time is limited to the predetermined value C, so that an unnatural change in the volume controlling is avoided.

In the above-mentioned embodiment, the rectifiers 110, 111, the gain controlled amplifier 112, the subtractor 113 are structured analog elements. However, it is also possible that the operations of the rectifiers 110, 111, the gain controlled amplifier 112, the subtractor 113 may be executed by the microprocessor 116 or digital circuits.

The noise sound can be detected accurately because the lowpass filters 108 and 109 are provided.

Moreover, the volume controlling can be without unnatural feeling because the low frequency range of the sound signal or low and high frequency ranges of the sound signal is enhanced in accordance with the magnitude of the environmental sound noise. The change of the class determined by the sound level detection portion 114 is limited, so that the volume adjusting is smooth in the hearing feeling.

This sound reproducing apparatus can effect an accurate volume controlling in accordance with the actual environmental sound noise detected irrespective of a speed signal or the engine rotation speed signal by detecting the difference between the sound signal from the sound source and the sound detection signal detected by the microphone 107. Moreover, because the volume control is executed through the sound detection signal detected by the microphone 107, in case that the magnitude of the reproduced sound is changed by changing the power amplifier 104, the speaker 105, or the like, an actual environmental noise can be detected.

Hereinbelow will be described a second embodiment of this invention.

Figure 4:
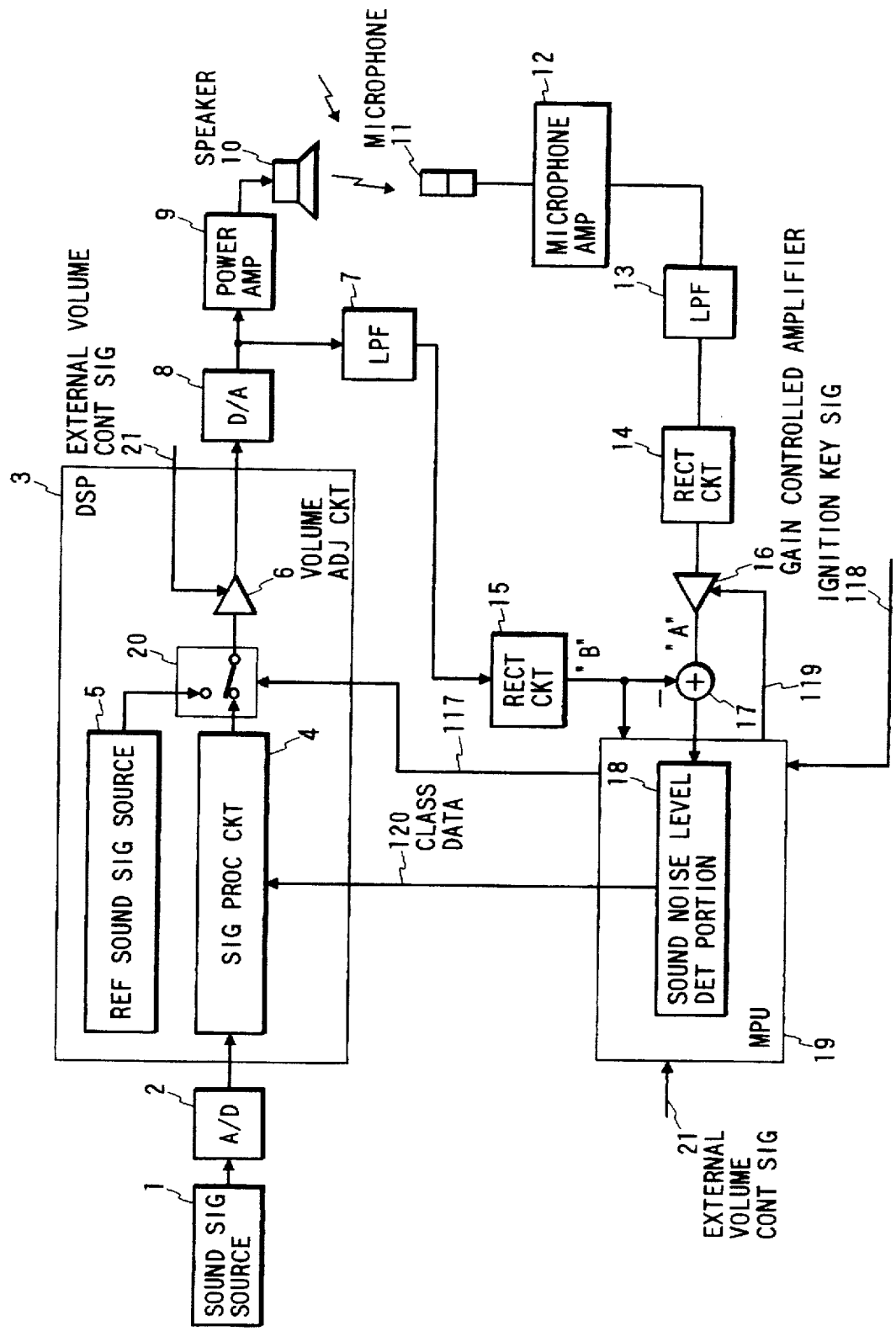
FIG. 4 is a block diagram of a sound reproduction apparatus of a second embodiment.

FIG. 4 is a block diagram of a sound reproduction apparatus of the second embodiment. The sound reproduction apparatus of the second embodiment comprises: a sound source 1 for generating a sound signal; an a/d converter 2 for a/d-converting the sound signal; a digital signal processing circuit (DSP) 3 having a reference sound signal source 5 for generating a reference sound signal having a predetermined intensity, a signal processing circuit 4 for processing a digital sound signal from the a/d converter 2; a switch 20 for outputting either of an output of the signal processing circuit 4 or an output of the reference sound signal source 5; and a volume adjusting circuit 6 for adjusting a volume of an output of the switch 20 in accordance with an external volume control signal 21; a d/a converter 8 for d/a-converting an output of the volume adjusting circuit 6; a power amplifier 9 for amplifying an output of the d/a converter 8; a lowpass filter 7 for lowpass-filtering the output of the d/a converter 8, a rectifying circuit 15 for detecting a magnitude of an output of the lowpass filter 7, namely, an absolute value of the magnitude of the output of the lowpass filter 7 through rectifying; a power amplifier 9 for amplifying an output of the d/a converter 8, a speaker 10 for generating a sound from an output of the power amplifier 9, a microphone 11 for receiving the sound from the speaker 10 and receiving environmental noise sounds, such as an engine running sound, in a compartment of a vehicle in which this sound reproduction apparatus is provided, a microphone amplifier 12 for amplifying the output of the microphone 11, a lowpass filter 13 for lowpass-filtering an output of the microphone amplifier 12, a rectifying circuit 14 for detecting a sound intensity of the sound from the speaker 10 and the environment sound noise by rectifying an output of the lowpass filter 13 to obtain an absolute magnitude value of the output of the lowpass filter 13, a gain controlled amplifier 16 for amplifying the output of the rectifying circuit 14 with a gain controlled; a subtractor 17 for subtracting an output of the rectifying circuit 15 from the output of the gain controlled amplifier 16; a sound level detection portion 18, included in a microprocessor 19, for detecting a sound noise intensity in the compartment of the vehicle by averaging the output of the subtractor 17 and classifying the averaged output of the subtractor 17, wherein a volume of the output of the signal processing circuit 4 is controlled in accordance with the classified averaged output of the subtractor 17 and the microprocessor 19 controls the switch 20 and detects the output of the subtractor 17 and generates a gain control signal 119 supplied to the gain controlled amplifier 16 to control of a gain of the gain controlled amplifier 16 such that the output of the subtractor 17 is substantially zero when there is substantially no noise in the compartment of the vehicle.

An operation of the second embodiment will be described.

The sound source 1 such as a magnetic tape player, radio, or the like generates a sound signal. The a/d converter 2 a/d-converts the sound signal. The digital signal processing circuit 3 has the reference sound signal source 5, the signal processing circuit 4, the switch 20, and the volume adjusting circuit 6. The signal processing circuit 4 processes a digital sound signal from the a/d converter 2. For example, the signal processing circuit 4 changes a volume of the signal processing circuit 4. The reference sound signal source 5 generates a pink noise as a reference sound signal. The switch 20 outputs either of the output of the signal processing circuit 4 or the output of the reference sound signal source 5 in accordance with a switch control signal 117. The volume adjusting circuit 6 adjusts a volume of an output thereof in accordance with an external volume control signal 21.

The d/a converter 8 d/a-converts the output of the volume adjusting circuit 6. The power amplifier 9 amplifies the output of the d/a converter 8. The lowpass filter 7 lowpass-filters the output of the d/a converter 8. The rectifying circuit 15 detects the magnitude of the output of the lowpass filter 7, namely, an absolute value of the magnitude of the output of the lowpass filter 7 through rectifying. The power amplifier amplifies the output of the d/a converter 8. The speaker 10 generates a sound from the output of the power amplifier 9. The microphone 11 receives the sound from the speaker 10 and receives environmental noise sounds, such as an engine running sound, in a compartment of the vehicle in which this sound reproduction apparatus is provided. The microphone amplifier 12 amplifies the output of the microphone 11. The lowpass filter 13 lowpass-filters the output of the microphone amplifier 12. The rectifying circuit 14 detects a sound intensity of the sound from the speaker 10 and the environment sound noise by rectifying the output of the lowpass filter 13 to obtain an absolute magnitude value of the output of the lowpass filter 13. The gain controlled amplifier 16 amplifies the output of the rectifying circuit 14 with a gain controlled. The subtractor 17 subtracts the output of the rectifying circuit 15 from the output of the gain controlled amplifier 16. The sound level detection portion 18, included in the microprocessor 19, detects a sound noise intensity in the compartment of the vehicle by averaging the output of the subtractor 17 and classifying the averaged output of the subtractor 17, wherein a volume of the output of the signal processing circuit 4 is controlled in accordance with the classified averaged output of the subtractor 17 and the microprocessor 19 controls the switch 20 and detects the output of the subtractor 17 and generates a gain control signal 119 supplied to the gain controlled amplifier 16 to control of a gain of the gain controlled amplifier 16 such that the output of the subtractor 17 is substantially zero when there is substantially no environmental sound noise in the compartment of the vehicle.

Figure 5:
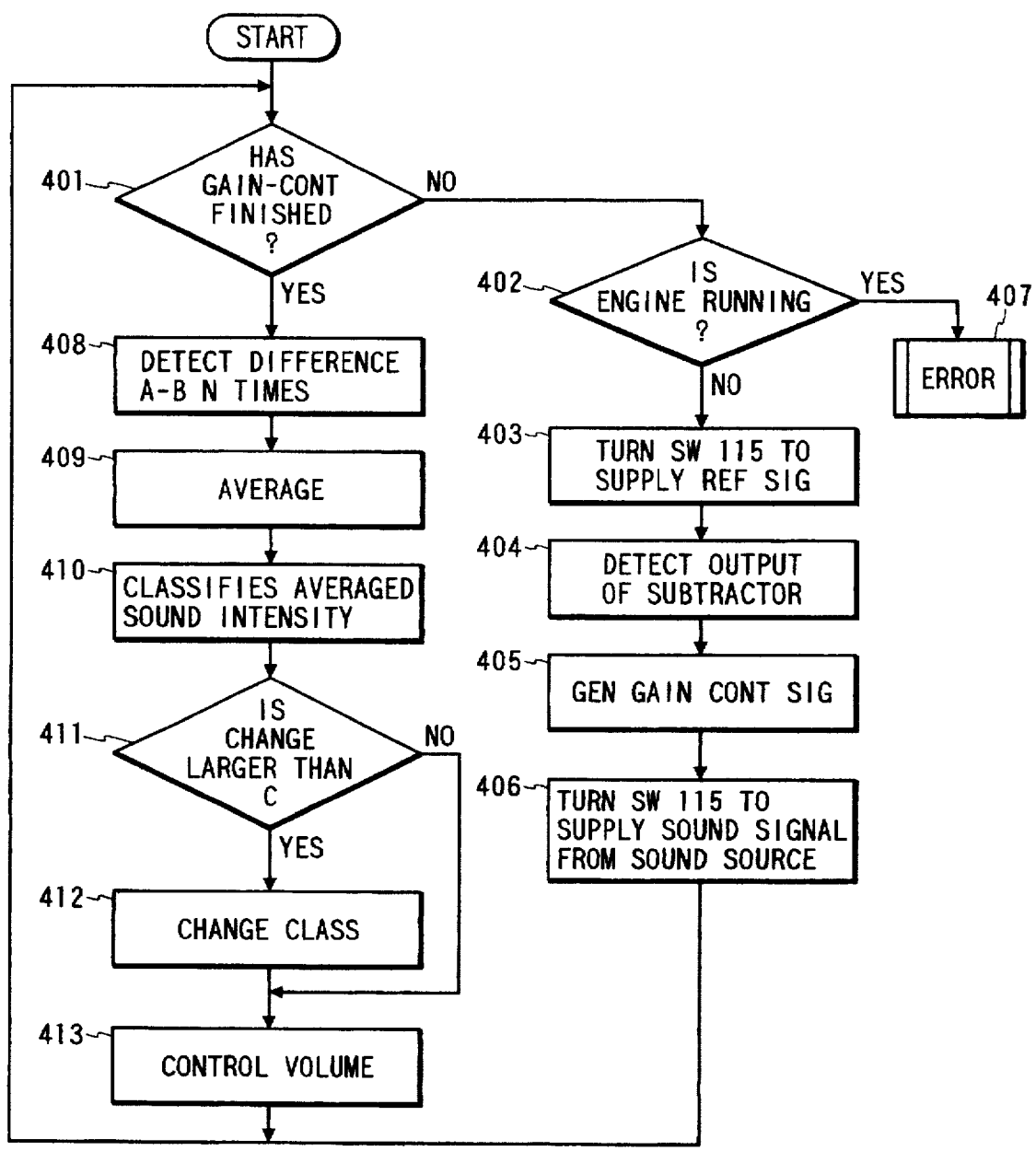
FIG. 5 is a diagram of a flow chart of the second embodiment.

FIG. 5 is a diagram of a flow chart of the second embodiment. The microprocessor 19 executes a program stored therein as shown in the flow chart in FIG. 5. At first, the gain controlling of the gain controlled amplifier 16 is executed. The microprocessor 19 makes a decision as to whether or not the gain controlling has finished in step 401. If the gain controlling has finished, processing proceeds to step 408. If the gain controlling has not finished, the microprocessor 19 makes a decision as to whether or not the engine (not shown) is running by checking an ignition key signal or the like in step 402. If the engine is running, processing proceeds to an error processing where an error processing is executed in step 407. If the engine is not running in step 402, that is, there is substantially no environmental sound noise in the compartment of the vehicle, the microprocessor 19 controls the switch 20 to supply the output of the reference signal generator 5 to the volume adjusting circuit 6 and operates the reference signal generation circuit 5 in step 403. In the following step 404, the microprocessor 19 detects the output of the subtractor 17 which is obtained by subtracting the absolute value B of the output of the rectifier 15 from the absolute value A of the output of the gain controlled amplifier 16 in step 404. Then, the microprocessor 19 determines the gain of the gain controlled amplifier 16 making the absolute value B of the output of the rectifier 15 substantially equal to the absolute value A of the gain controlled amplifier 16 and the controls the gain of the gain controlled amplifier 16 in step 405 by generating the gain control signal 119. Then, the microprocessor 19 controls the reference signal generator 5 to stop the generation of the reference signal and controls the switch 20 to supply the output of the sound source 1 to the signal processing circuit in step 406. Then, processing returns to step 401.

In this condition, the difference between the absolute values of the rectifier 15 and the gain controlled amplifier 16 corresponds to an environmental sound noise detected by the microphone 11, that is, a sound noise from the engine, a sound noise from other vehicles or the like.

In step 401, if the gain controlling has finished, the microprocessor 19 detects the difference between the absolute value A of the output of the rectifier 15 and the output B of the gain controlled amplifier 16, that is, the output of the subtractor 17 subtracting the output of the rectifier 15 from the output of the gain amplifier 16 and repeats this operation every a predetermined interval N times in step 408 to a predetermined number N of difference values. In the following step 409, the microprocessor 19 averages the predetermined number N of difference values. Then, the microprocessor 19 classifies the average value into a predetermined number of classes with predetermined threshold levels in step 410. In step 411, the microprocessor 116 makes a decision as to whether or not a change between the currently classified average value and average value at the last time is larger than a predetermined value C. If the change is larger than the predetermined value C, the microprocessor 19 changes the class (class data) with the change limited in step 412. If the change is not larger than the predetermined value, the microprocessor 19 does not change the class and processing proceeds to step 413 directly. In step 412, the microprocessor 19 outputs a class data indicative of the determined class to control the volume of the output of the signal processing circuit 4.

In the signal processing circuit 4, the volume thereof may be adjusted over an audio frequency range, a volume thereof is adjusted over a low audio frequency range, or a volume thereof is adjusted over low and high audio frequency ranges in accordance with the class data 102. Moreover, a low audio frequency range is more enhanced than the middle audio frequency range.

Figure 6:
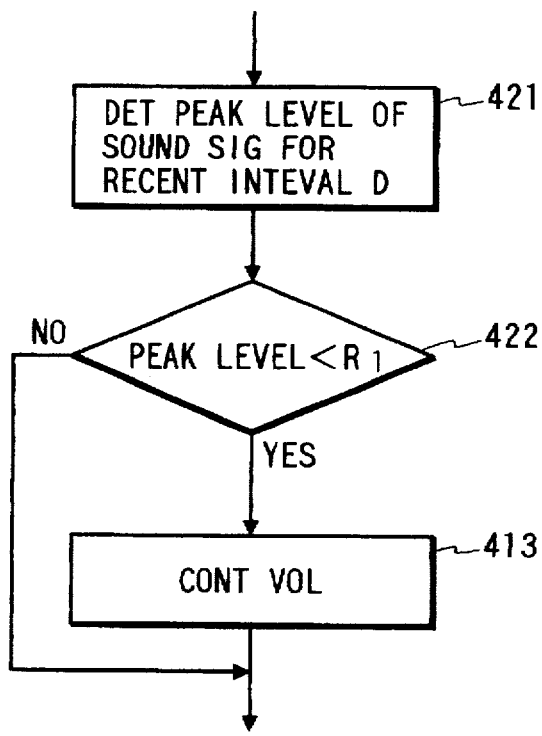
FIGS. 6 and 7 are diagrams of partial flow charts of modifications of the second embodiment.
Figure 7:
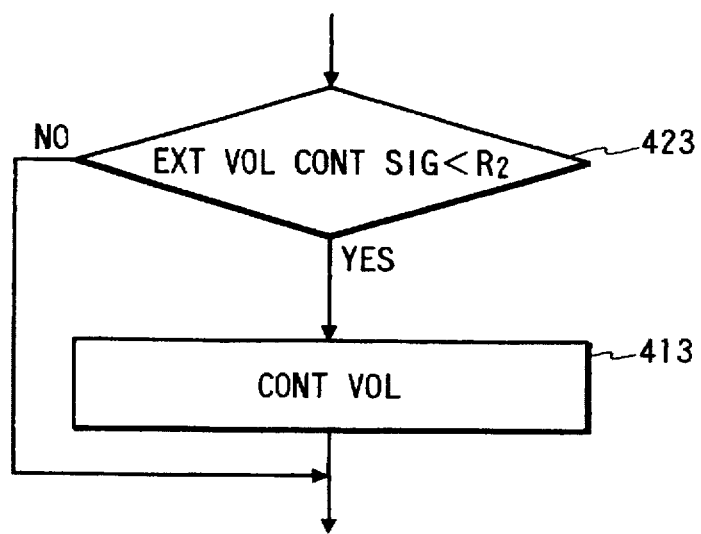
Figure 8:
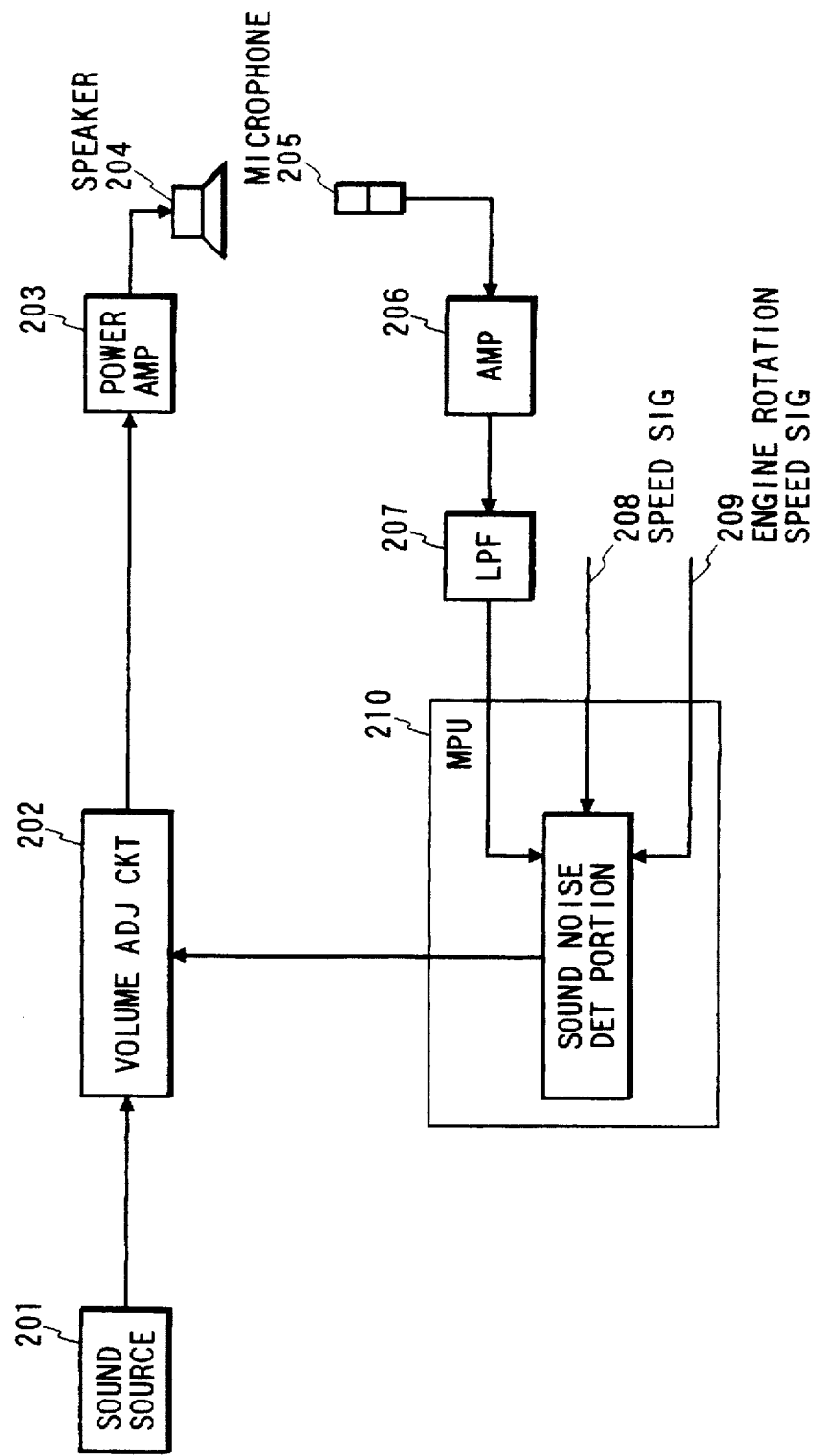
FIG. 8 is a block diagram of such a prior art sound reproduction apparatus.

FIGS. 6 and 7 are diagrams of partial flow charts of modifications of the second embodiment. These processings are executed just before step 413 in FIG. 5. In FIG. 6, after step 412 or 411, the microprocessor 19 detects a peak level of the sound signal, namely, the output of the rectifying circuit 15, through an a/d converter originally provided to the microprocessor 19 for a recent predetermined peak level detection interval in step 421. In the following step 422, the microprocessor 19 makes a decision as to whether the peak level is smaller than a reference value R1. If the peak level is smaller than the reference value R1, processing in step 413 is made but if the peak level is not smaller than the reference value R1, processing proceeds to the step 401 without executing the step 413. That is, if the peak level is large to a some extent, the volume control is not effected or is limited though there is a sound noise in the compartment.

In FIG. 7, after step 412 or 411, the microprocessor 19 makes a decision as to whether the external volume control signal 21 is smaller than a reference value R2. If a value of the external volume control signal is smaller than the reference value R2, processing in step 413 is made but if the external volume control signal has a value not smaller than the reference value R2, processing proceeds to the step 401 without executing the step 413. That is, if the value of the external volume control signal, that is, the magnitude of the reproduced sound, is large to a some extent, the volume control is not effected or is limited though the sound noise is large.

As mentioned, the actual sound noise can be detected by obtaining the difference between the sound intensity of the sound, generated from the sound signal from the sound source 1, transmitted from the speaker 10 through the compartment of the vehicle, received by the microphone 11 and the intensity of the sound signal from the sound source 1 by the subtractor 17. Then, the volume of the sound is controlled in accordance with the detected difference (sound noise). Prior to this controlling, at first, gains of the signal passes to the subtractor 17 are equalized in a substantially no sound noise condition (substantially silent condition of the compartment) using a reference sound signal, such as a pink noise. However, it is also possible to use the sound signal from the sound source 1, particularly, the noise generated by the radio circuit when the radio circuit is not tuned as a quasi-white noise. Further, the difference values are averaged to obtain an accurate difference value. Moreover, the change between the currently classified averaged difference value and the classified averaged difference value at the last time is limited to the predetermined value C, so that an unnatural change in the volume controlling is avoided.

In the above-mentioned embodiment, the rectifiers 14, 15, the gain controlled amplifier 16, the subtractor 17 are structured analog elements. However, it is also possible the operations of the rectifiers 14, 15, the gain controlled amplifier 16, the subtractor 17 may be executed by a microprocessor or digital circuits.

The noise sound can be detected accurately because the lowpass filters 13 and 14 are provided.

Moreover, the volume controlling can be without unnatural feeling because the low frequency range of the sound signal or low and high frequency ranges of the sound signal is enhanced. The change of the class determined by the sound level detection portion 18 between two consecutive averaging periods is limited, so that the volume adjusting is smooth in the hearing feeling.

This sound reproducing apparatus can effect an accurate volume controlling in accordance with the actual environmental sound noise detected irrespective of a speed signal or the engine rotation speed signal by detecting the difference between the sound signal from the sound source and the sound detection signal detected by the microphone 11. Moreover, because the volume control is executed through the sound detection signal detected by the microphone 11, though the magnitude of the reproduced sound is changed by changing the power amplifier 9, the speaker 10, or the like, an actual environmental noise can be detected.

In these embodiments, the gain controlled amplifier is provided to the signal passage including the microphone. However, it is also possible that the gain controlled amplifier is provided in the signal path from the sound signal to the subtractor.

What is claimed is:

1. A sound reproduction apparatus for a vehicle comprising:

a sound source for generating a sound signal;

sound reproduction means for generating and emitting a sound from said sound signal into a compartment of said vehicle;

a microphone, provided in said compartment, for detecting the sound transmitted in said compartment and environmental sound noise and for generating a sound detection signal;

detection means for detecting a magnitude of said environmental sound noise by detecting a difference between magnitudes of said sound signal and said sound detection signal;

volume control means for effecting volume controlling of said sound signal in accordance with said magnitude of said environmental sound noise from said detection means; and equalizing means for substantially equalizing a first signal path of said sound signal supplied to said detection means and a second gain of a second signal path of said sound detection signals supplied to said detection means.

2. A sound reproduction apparatus as claimed in claim 1, wherein said equalizing means determines said first and second gains when a conditional signal indicates a substantially silent condition of said compartment.

3. A sound reproduction apparatus as claimed in claim 2, further comprising reference sound signal generation means for generating a reference sound signal having a predetermined intensity as said sound signal when said equalizing means determines said first and second gains.

4. A sound reproduction apparatus as claimed in claim 2, wherein said sound source comprises a radio receiver, having a tuner, for generating said sound signal having a substantially predetermined intensity by tuning said tuner in a non-tuned condition to provide a white noise signal in said sound signal when said equalizing means determines said first and second gains.

5. A sound reproduction apparatus as claimed in claim 1, wherein said volume control means effects said volume controlling of said sound signal such that said sound signal is enhanced at a part of audio frequency range of said sound signal.

6. A sound reproduction apparatus as claimed in claim 1, further comprising a lowpass filter for lowpass-filtering said sound signal supplied to said detection means.

7. A sound reproduction apparatus as claimed in claim 1, further comprising a lowpass filter for lowpass-filtering said sound detection signal supplied to said detection means.

8. A sound reproduction apparatus as claimed in claim 1, wherein said volume control means further effects second volume controlling of said sound signal in accordance with an external volume control signal and said volume control means effects said volume controlling of said sound signal in accordance with said magnitude of said environmental sound noise from said detection means such that a change in a volume of said sound signal is changed in accordance with a value of said external volume control signal.

9. A sound reproduction apparatus as claimed in claim 1, wherein said volume control means comprises a signal processing circuit for enhancing said sound signal at a low-frequency range in accordance with said magnitude of said environmental sound noise from said detection means.

10. A sound reproduction apparatus as claimed in claim 1, wherein said volume control means further effects second volume controlling of said sound signal in accordance with an external volume control signal, further comprises comparing means for comparing a value of said external volume control signal with a reference value, and said volume control means effects said volume controlling of said sound signal when said value of said external volume control signal is smaller than said reference value.

11. A sound reproduction apparatus as claimed in claim 1, wherein said volume control means increases a volume of said sound signal in accordance with said magnitude of said environmental sound noise from said detection means.

12. A sound reproduction apparatus as claimed in claim 1, wherein said detection means further comprises averaging means for obtaining an average of said difference for a predetermined averaging period and said volume control means effects said volume controlling of said sound signal in accordance with said average of said difference.

13. A sound reproduction apparatus as claimed in claim 12, wherein said detection means further comprises classifying means for classifying said average of said difference into predetermined volume classes and said volume control means effects said volume controlling of said sound signal in accordance with one of said predetermined volume class determined.

14. A sound reproduction apparatus for a vehicle as claimed in claim 1, further comprising peak detection means for detecting a peak level for a predetermined interval and comparing means for comparing said detected peak level with a reference value, said volume control means effecting said volume controlling of said sound signal when said detected peak level is smaller than said reference value.

15. A sound reproduction apparatus for a vehicle comprising:

a sound source for generating a sound signal;

sound reproduction means for generating and emitting a sound from said sound signal into a compartment of said vehicle;

a microphone, provided in said compartment, for detecting the sound transmitted in said compartment and environmental sound noise and for generating a sound detection signal;

detection means for detecting a magnitude of said environmental sound noise by detecting a difference between magnitudes of said sound signal and said sound detection signal; and volume control means for effecting volume controlling of said sound signal in accordance with said magnitude of said environmental sound noise from said detection means;

wherein said detection means further comprises averaging means for obtaining an average of said difference for a predetermined averaging period and said volume control means effects said volume controlling of said sound signal in accordance with said average of said difference;

wherein said detection means further comprises classifying means for classifying said average of said difference into predetermined volume classes and said volume control means effects said volume controlling of said sound signal in accordance with one of said predetermined volume class determined; and wherein said detection means further comprises operation means for obtaining a change between said one of said predetermined volume classes determined from said average currently obtained and another of said predetermined volume classes determined from said average previously obtained, comparing means for comparing said change with a reference value, and limiting means for changing said one of said predetermined volume classes determined from said average currently obtained such that said change is limited when said change is larger than said reference value.

* * * * *